United States Patent
Beck et al.

[11] Patent Number: 5,980,683
[45] Date of Patent: Nov. 9, 1999

[54] PRODUCTION OF A SUPPORT ELEMENT MODULE FOR EMBEDDING INTO SMART CARDS OR OTHER DATA CARRIER CARDS

[75] Inventors: Wolfgang Beck, Wildberg; Reinhold Braun, Leonberg; Roland Diemer, Aidlingen; Frank Druschke, Stuttgart; Gerhard Elsner, Kaarst; Harald Gruber, Herrenberg; Rainer Kratzert, Böblingen; Wolfgang Schmid, Nufringen, all of Germany

[73] Assignee: International Business Machines Corporation, Armonk, N.Y.

[21] Appl. No.: 08/793,181

[22] PCT Filed: Jun. 6, 1995

[86] PCT No.: PCT/EP95/02150

§ 371 Date: Jan. 31, 1997

§ 102(e) Date: Jan. 31, 1997

[87] PCT Pub. No.: WO96/04611

PCT Pub. Date: Feb. 15, 1996

[30] Foreign Application Priority Data

Aug. 2, 1994 [DE] Germany ............... 44 27 309

[51] Int. Cl.⁶ ........................................ H05K 3/00
[52] U.S. Cl. ......................... 156/289; 264/272.17
[58] Field of Search .................. 156/289; 264/272.13, 264/272.14, 272.15, 272.17, 264

[56] References Cited

U.S. PATENT DOCUMENTS

| | | | |
|---|---|---|---|
| 4,514,752 | 4/1985 | Engel et al. | 264/264 X |
| 4,927,580 | 5/1990 | Nasu et al. | 264/264 X |
| 5,273,475 | 12/1993 | Oshikawa | 156/163 X |
| 5,386,342 | 1/1995 | Rostoker | 264/264 X |

Primary Examiner—Francis J. Lorin
Attorney, Agent, or Firm—K. O. Hesse

[57] ABSTRACT

Described is a method for manufacturing of carrier element modules of a thin carrier element (4) and a thereon mounted semiconductor chip (2). This method renders possible the application of chips (2) with great dimensions (macro-chips) and a wide variety of different types. A chip transfer moulding process is designed so that a minimised height—without the need for reworking—is achievable, and therefore a less costly surface mounting of the chips can be applied. The manufactured module according to the invention can be used as well as in flexible circuit boards (e.g. for cameras) or in chipcards. The method according to the present invention has a first step of putting the at least one IC (2) onto the carrier element (4), a second step of contacting the at least one IC (2) with the carrier element (4) and a third step of transfer moulding a transfer moulding compound (18) to encapsulate the IC (2).

20 Claims, 2 Drawing Sheets

PRODUCTION OF A SUPPORT ELEMENT MODULE FOR EMBEDDING INTO SMART CARDS OR OTHER DATA CARRIER CARDS

TECHNICAL FIELD

This present invention relates to a process for the manufacture of a carrier element module, including one carrier element and at least one IC chip, more particularly, a macro-chip with large dimensions, which is preferably provided for use in chip cards or other data carrier cards.

DESCRIPTION OF RELATED ART

Chip cards which have been used recently for the processing of information, for example multi-functional chip cards or telephone cards generally consist of a single or multiple layer insulated carrier element module, which carries the integrated semi-conductor circuit chip in a recess in a carrier element, for example, or located on the surface of the carrier element.

The wiring of the chip with the external contacts can be carried out according to the method known to the art from patent document DE-C-3029667, using a form of contacting technology known as "wire bonding". According to this process, the connection points of the chip are connected with the contact areas of the carrier element by means of, for example, fine gold wires.

"Tape Automated Bonding" (TAB) is known to the art from U.S. Pat. No. 4,474,292 as a contacting possibility between the chip and the contact areas of the carrier element. To provide contact between the chip and the appropriate wiring, the wiring patterns contain contact fingers, which lead in the form of what are known as a contact spider in the direction from the outside towards the inside of the chip. The chip is then located on the ends of these contact fingers of the circuit, by means of ultrasonic welding.

A further possibility for contacting is by means of "plated through holes" (PTH), as is described in UK patent application GB 2 081 974 A.

In the further application (reference: . . . , GE994016) the use or what is known as C4 technology is proposed to produce an electrical connection between an IC and a carrier element, which is provided for use in chip cards or other data carrier cards. This enables a high integration of the IC with a correspondingly large number of contacts for communication between the IC and its external environment.

After contacting between the chip and carrier, the chip is encapsulated in the carrier or coated on the carrier with a cast resin drop in order to cut out environmental influences. The essentially convex shape formed by the cast resin coating has proved to be problematic here, however, in particular in the manufacture of chips with large surfaces. In particular in the coating of large surface and also, with respect to the height to surface ratio, relatively flat chips, the convex and relatively undefined drop shape remaining after curing requires reworking, e.g. by means of an abrasive process, in order to achieve smaller overall heights.

All methods known to the art for the manufacturing of carrier elements for ICs share the characteristic, that chips with great dimensions (macro chips) cannot be used or can be used only at great expense. As a result of this, the manufacturing of mass produced articles is not possible with maximum storage density, such as chip cards and flexible circuit boards.

SUMMARY OF THE INVENTION

It is therefore an object of the present invention to find a process for the manufacture of carrier element modules with ICs which enables the use of chips with great dimensions (macro chips).

The object of the present invention is solved by means of the method according to the independent patent claim 1.

The manufacturing process according to the present invention also allows the manufacture of carrier element modules with large surface chips (e.g. with high storage density), as are required as the result of the increasing information requirement with growing applications possibilities, in particular of chip cards. This is possible as a result of being able to manufacture modules with a small and defined overall height.

The use of the transfer moulding process with a transfer moulding compound with predetermined features makes it possible, as a result of the definable shape of the chip coating in the transfer moulding process, to achieve small and defined heights and a small volume. The transfer mould compound thereby guarantees protection for the chip against cracks and environmental influences.

Also using the process according to the present invention, carrier elements can be used which consist of an insulator, preferably fibre reinforced polymers and a metallic contact layer, whereby the chip then basically sits on the insulator and is connected with the contact layer.

The use of a parting agent with predetermined characteristics enables the branches moulded to the carrier element in the transfer moulding process to be detached simply and gently, in particular if thin fibre reinforced polymers are used as insulators. The parting agent as such makes the use possible for the first time of simple, cost-effective transfer moulding tools with lateral injection, directed on the carrier element, since otherwise the injection pieces remain attached to the carrier element surface and the carrier element surface may be damaged in the process necessary to remove the injection pieces.

It is possible to recognise the surface areas successfully coated with the parting agent, by using colourable parting agents, which results in a contrast and it therefore becomes easy to recognise the areas wetted with parting agent.

By using an adhesive with a predetermined characteristic profile, a reliable join can be achieved between the chip and the carrier element.

The use and combination according to the present invention of the necessary materials allows both as short a process cycle as possible and a simple, quick and economic module manufacturing process, which can be carried out completely on a line and without any intermediate steps.

DESCRIPTION OF THE DRAWINGS

In order to provide a more precise explanation of the invention, design examples are given below with reference to the drawings.

DESCRIPTION OF THE PREFERRED EMBODIMENTS

FIGS. 1A to 1D show a process according to the present invention for the manufacture of a carrier element module consisting of one chip 2 and one carrier element 4 by locating the chip 2 on the carrier element 4, shown in cross-section. The carrier element 4 consists of a contact layer 8 applied flat onto an insulator 6, whereby the insulator 6 preferably consists of glass fibre reinforced epoxy resin or fibre reinforced polyimide. The carrier element 4 is, in a further step, introduced into what is known as a smartcard, on which data can be stored and processed. The contact layer 8 of the carrier element 4 is then used to contact the chip 2 with its surroundings, e.g. a smartcard reading device, corresponding to the applications of the smartcard.

Figure 1A:
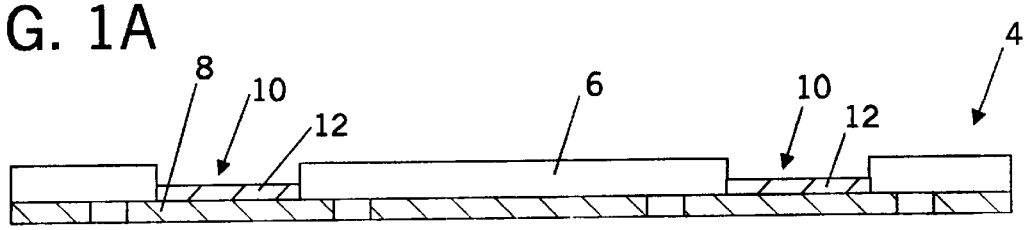
FIGS. 1A to 1D show a process according to the present invention for the manufacture of a carrier element module including one chip and one carrier element.

In FIG. 1A, circular holes 10 have been punched in the insulator 6 for subsequent wiring of the chip 2. Next on the underside of the insulator 6, an electrically conductive foil (e.g. 3.5 $\mu$m copper foil) is glued as the contact layer 8, from which then the strip conductors, the conductive middle zone and the non-conductive strips are wet-chemically engraved. This is followed by the electrochemical coating of the conductive copper structures of the contact layer 8 with nickel and gold, which then form Ni/Au contacts 12.

Figure 1B:
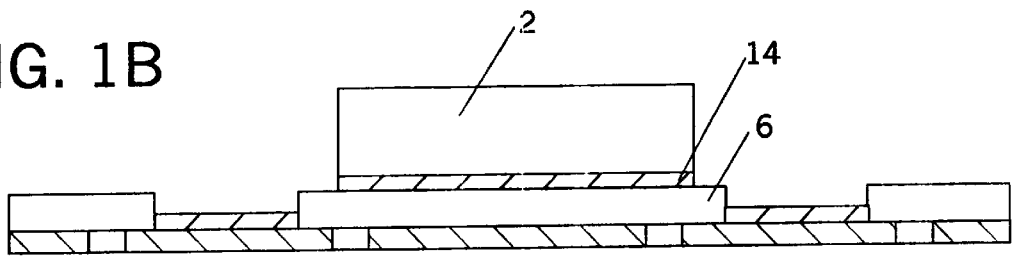

Then, as shown in FIG. 1B, on the upper side of the insulator 6, in that area a drop of adhesive is applied to be used to connect the chip 2 mechanically to the carrier element 4.

In using the adhesive 14, a distinction is to be made between the various electrical contacting possibilities of chip 2 to carrier element 4, as detailed in a subsequent step in the process. If the connecting points of chip 2 and carrier element 4 are opposite one another, e.g. as in TAB or C4 technology, mechanical stabilisation through the use of the adhesive 14 is of less importance or it can even be dispensed with totally, since what is frequently a sufficiently strong mechanical join between chip 2 and carrier element 4 can already be achieved by contacting. It should be ensured, however, that no other or only an insignificant amount of other materials, such as a casting compound can penetrate in an undesirable manner into the space between the chip 2 and the surface of the carrier element 4 in the course of any subsequent steps in the process. This could otherwise result in a reduction in the mechanical stability of the combination of chip 2 and carrier element 4.

If, however, a sufficiently strong mechanical join cannot be achieved between chip 2 and carrier element 4 by contacting alone or if the intention is to prevent penetration by an undesired material into the space between the chip 2 and the surface of the carrier element 4, attention must be paid when selecting the material for the adhesive 14 to ensure that this adhesive has a sufficient working period, which includes any electrical contacting. In particular, premature curing must be prevented and a good tolerance to subsequent temperature steps must be guaranteed. There is generally a distinction to be made here as to whether the use of the adhesive 14 should take place before or after the electrical contacting. If the adhesive 14 is used after the electrical contacting, the mechanical stability of the combination of the carrier element module is favourably influenced, without having to accept the occurrence of any negative effect by the adhesive 14 during contacting.

When "wire bond" technology is used, the chip 2 is placed with its rear side on the carrier element 4 and the connecting points to be found on the opposite side of the chip 2 are connected with the contact areas 12 of the carrier element 4 using fine wires. When applying the adhesive 14 to the carrier element 4, it is important to pay attention to the fact that the adhesive 14 does not leave the area between the rear side of the chip 2 and the carrier element 4. Otherwise, there is a danger that during the transfer mould encapsulating of chip 2, as shown in FIG. 1D and described later, the transfer moulding compound does not adhere to the module sufficiently as the result of contact with the adhesive 14 and this can lead to breaking off. At the same time it is important to ensure that the contact areas 12 are not wetted by the adhesive 14, thereby impairing electrical contact.

After applying the adhesive 14, as shown in FIG. 1B, precuring takes place, e.g. using infrared heating, a heated plate, a heating shoe, a heating stage, an oven, a circulation oven or hot-air oven, for initial fixing so that the chip 2 remains in position during the subsequent (final) curing. Precuring of the adhesive 14 is followed by curing in an oven ("final cure").

Figure 1C:
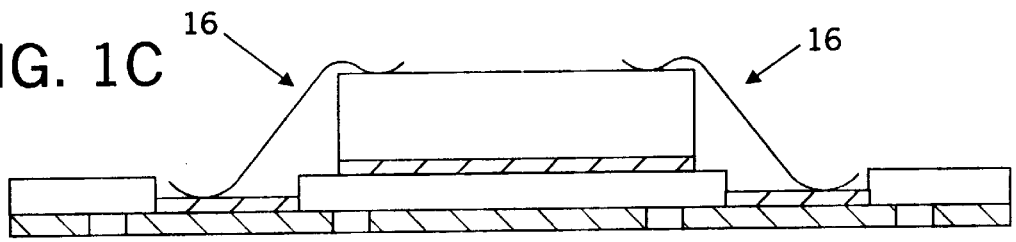
Figure 1D:
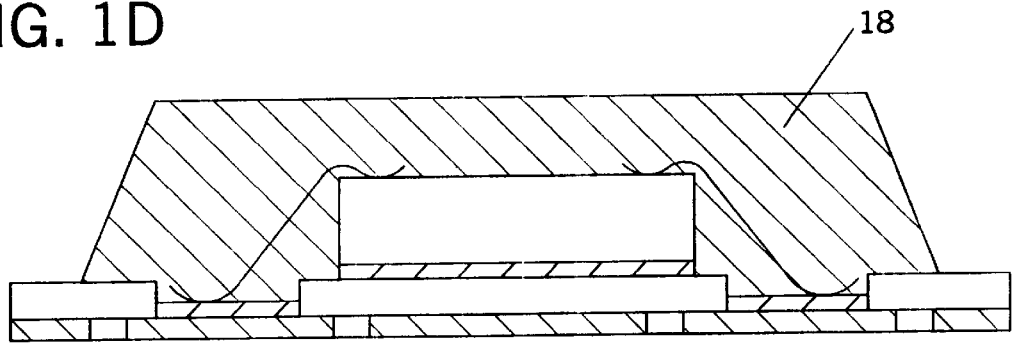

In the design example according to FIG. 1C, "wire bonding" is chosen as the contacting process. In this process the connecting points of the chip 2, e.g. a macro chip with a surface area of, for example, 27.2 mm$^2$, are connected with the contact areas of the carrier element 4 using fine metal wires 16 (e.g. gold or aluminium wires). Correspondingly, however, any other contacting process can be used, in particular one of those referred to at the beginning.

It is a requirement of the thin adhesive layer 14 to be found under the chip 2, that during the subsequent process steps, which include, inter alia, encapsulating the chip 2 by means of transfer moulding, the adhesive 14 does not display any further softening. Otherwise, movement may occur during transfer moulding of the chip 2, which takes place at 180° C. and thereby break off the contacting between the chip 2 and the carrier element 4, e.g. previously contacted aluminium wires. In addition the adhesive layer 14 must fill the space between the chip 2 and the carrier element 4 uniformly without any bubbles, since at the transfer moulding temperature of 180° C. the air in any bubbles possibly sealed in the adhesive layer 14 increases in pressure, as a result of which the chip 2 either jumps off or may break.

Figure 2:
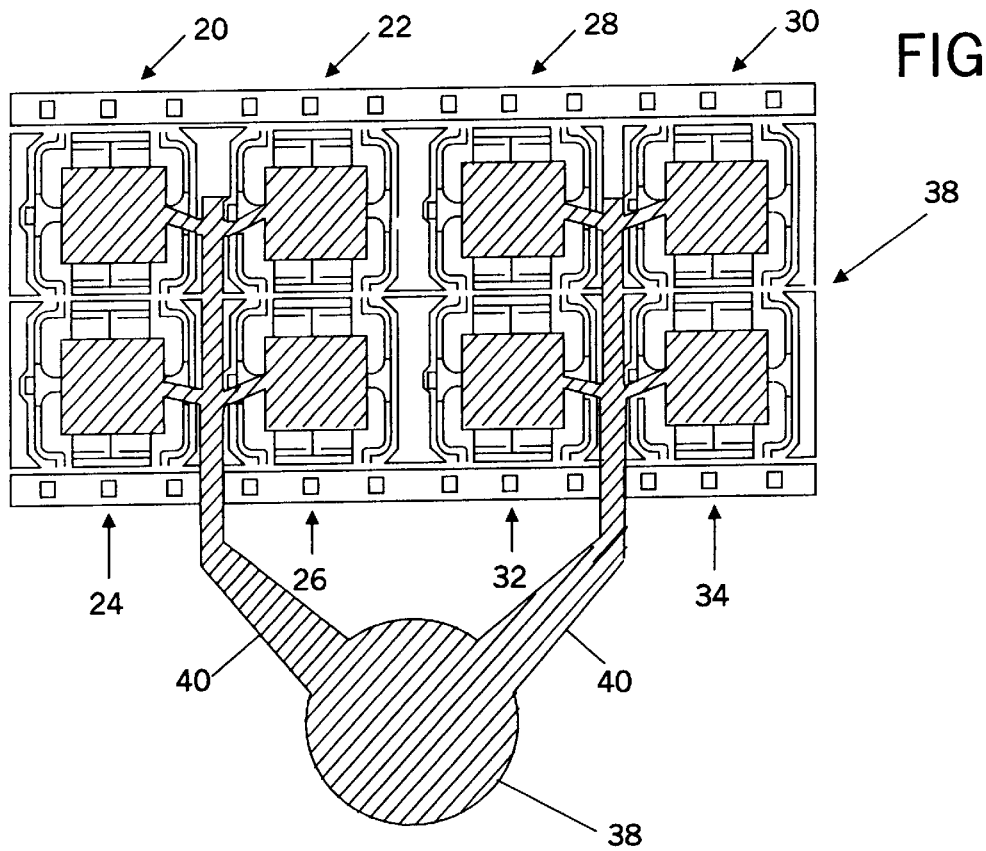
FIG. 2 shows a top view in relation to the projections in FIGS. 1A to 1D of the transfer moulding process.

Furthermore, the adhesive 14 must not release any volatile matter (e.g. low-molecular substances) during curing, since these also can affect the reliability of the connection between the chip 2 and the carrier element 4. Finally, however, the adhesive layer 14 must have a certain degree of elasticity after curing, since the carrier element 4 with the glued chip 2 can be subjected to many bending stresses in the module manufacturing process (e.g. in processing as continuous film in a rolled form, as can be seen in FIG. 2).

When using adhesives with fillers (e.g. ceramic particles), the thermal expansion coefficient of the adhesive may be adjusted to the combination of the carrier element 4 and the chip 2 and therefore adapted to compensate for stresses. The grain size distribution of the filler particles must not exceed the value for the maximum allowed layer thickness of the adhesive, e.g. approximately less than 150 $\mu$m, with the result that this required layer thickness for the adhesive 14 is also achieved.

To protect the chip 2 against breakage and environmental influences, it is encapsulated by means of a transfer moulding process as shown in FIG. 1D, preferably at a temperature of approximately 180° C. The transfer moulding material 18 must have the characteristics described below: the transfer moulding material 18 must have a high flexural strength (approximately greater than 7 kp/mm$^2$ and preferably greater than 13 kp/mm$^2$) and a low thermal expansion coefficient (approximately less than $50 \times 10^{-6}$ ° C.$^{-1}$ and preferably less than $17 \times 10^{-6}$ °C.$^{-1}$), since the combination consisting of carrier element 4, chip 2, transfer mould compound 18 and any adhesive 14 therefore has low mechanical stresses. Mechanical stresses can otherwise have an unfavourable effect on the contacting, e.g. the wire bond connections 16 on the upper side of the chip 2 and negatively affect the reliability and integrity of the module during manufacture and use.

In addition, the transfer moulding material 18 may contract only to an insignificant extent during cooling, which can be achieved by adding fillers, since too great a contraction can also affect the wire bond connections. Furthermore, as short a curing period as possible is required for the transfer moulding compound 18 (preferably less than one minute), in order to achieve very short process times in module manufacturing. Moreover, the transfer moulding material 18 must be flame resistant and adhere well to the chip 2 and carrier element 4.

In order to protect the chip 2 against corrosion, the transfer moulding material 18 may absorb only a little moisture (preferably less than 1% after 48 hours boiling water treatment). This can be ensured if a suitable cross-linkable transfer moulding compound 18 is used.

FIG. 2 shows a top view of the transfer moulding process in relation to the view in FIGS. 1A to 1D. In the example of the form of the manufacturing process according to the present invention shown here, the carrier elements 20–34 are being processed as continuous film 36, which is subsequently separated into individual carrier element modules. The continuous film 36 consists, in accordance with the explanations given above, of the insulator 6, a thin epoxy glass cloth film, and the metallic contact layer 8. The contact layers of the carrier elements 20–34 can be seen in this diagram through the almost transparent insulator 6. The continuous film 36 can be developed between processing of the individual steps, preferably on a roll and passed in developed form through the sequence of steps in the process, preferably a production line.

In the transfer moulding process shown in FIG. 2, eight carrier elements 20–34 are encapsulated at the same time in one transfer moulding process. The transfer moulding compound 18 originates from a moulding, and after being heated briefly, is applied via a distributor 38 and the connected injection channels 40 to the carrier element 20–34 in question. Guidance of the transfer moulding compound 18 is ensured by means of a tool not shown here, which is removed again following the end of the transfer moulding process. Here the transfer moulding material 18 also cures in the injection channels 40 and remains after the tool is removed, as shown in FIG. 2.

As can also be seen from FIG. 2, the transfer moulding compound 18 is applied to the carrier element 20–34 in question in this example from the side, from the channels 40. This allows a simple and cost-effective formation of the transfer moulding tool in comparison with application of the transfer moulding compound from above, for example.

Good adhesion by the transfer moulding material 18 to the carrier element 4, as desired, has a very disadvantageous effect, however, where the injection channels 40 for the encapsulation of the chip 2 run onto the carrier element 4 and make contact with the carrier element, since they have to be removed once more after transfer moulding. Detachment of the injection channels 40 leads to enormous processing problems and makes encapsulation by means of transfer moulding technology more difficult.

Figure 3:
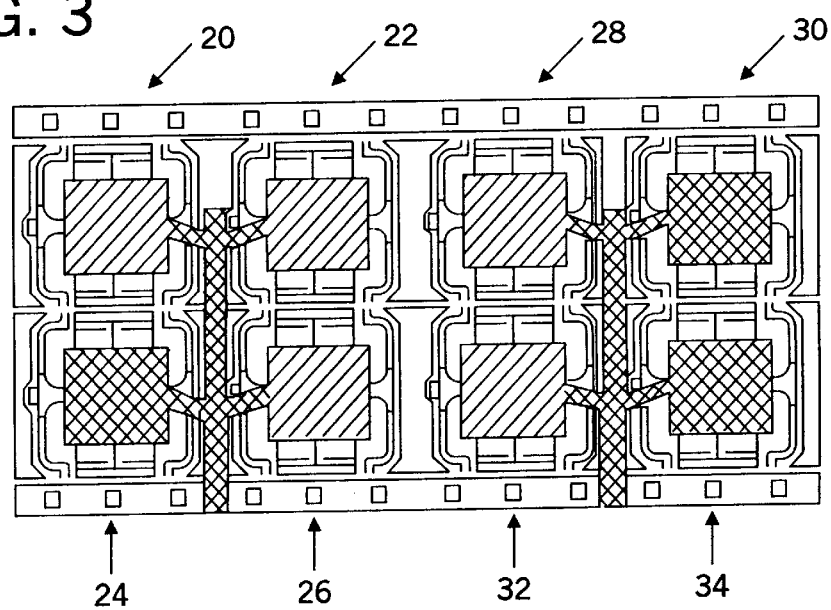
FIG. 3 shows the problem of defective removal of the injected channels.

FIG. 3 shows an example of the problem of defective removal of the injection channels 40. During defective removal, not only the injection channels 40 have been removed here but at the same time the lower left-hand and also both the outer right-hand chip coatings have been removed. On the detached points it can now be seen that part of the insulator 6 has also been removed with the transfer moulding material 18 in an undesired manner. This can be seen clearly by the fabric pattern on the carrier element surfaces resulting from the fabric strengthening. The surfaces damaged in this way now enable undesired penetration by moisture and particles, which may lead to corrosion and therefore to the failure of the chip functions. It should be noted at this point that the functional capability of the chip 2 is affected above all only by damage caused when breaking off the injection channels 40, since an undesired detachment of the coated chip 2 can easily be prevented by means of a corresponding dynamic effect in response to the forces engaged in the break off process.

In order to avoid any damage to the surfaces, it is suggested in one design form of the present invention that the surface of the continuous film 36 and/or the carrier elements 20–34 are rendered passive using a parting agent at least where the injection channels 40 run onto the surface of the carrier elements 20–34. Such parting agents must retain their parting agent characteristics under the conditions of the transfer moulding process, i.e. in particular be thermally stable. Furthermore, suitable parting agents must also not be volatile under the process conditions, in order to exclude the possibility of an uncontrolled spread over the surface of the carrier.

For economic use of the parting agent and in particular for an "on-line" application, i.e. application during the manufacturing process or in the course of the process, it is also necessary that the parting agent can be fixed or cross-linked on the carrier surface quickly, since otherwise undesired waiting times or discontinuities may occur in the process flow.

Organosilanes with low surface tension are generally suitable as parting agents, such as organofluorosilanes or alkyl- and arylalcoxysilanes. The following organosilanes have shown themselves to be advantageous for use according to the present invention: phenyltrimethoxysilane, phenyltriethoxysilane, phenyltrichlorosilane, methyltriethoxysilane, methyltrimethoxysilane, propyltrimethoxysilane, ethyltrichlorosilane, ethyltrimethoxysilane, diphenyldiethoxysilane, dimethyldichlorosilane, dimethyldiethoxysilane, perfluorooctyltriethoxysilane, dimethyldimethoxysilane, triphenylethoxysilane, triphenylethoxysilane [sic], dodecyltriethoxysilane, or similar.

The parting agents referred to may be applied as such, in particular in an application separate from the module manufacturing process or preferably also in the form of solutions or emulsions in concentrations from approximately 0.005 percent by weight. As light solvents as possible should be used such as ethanol, methanol, isopropanol, water, acetone, methyl ethyl ketone, methylene chloride, dioxan, etc., or mixtures of the same, in particular with water. In order to control better the reactivity of the parting agents used and improve the stability of the solutions, catalysts can also be added to the parting agent liquid, e.g. acetic acid or hydrochloric acid.

The coating of the carrier element 4 with the parting agent and/or solutions thereof can be carried out using suitable methods such as, for example, printing, daubing, brushing or writing with a felt-tip pen and also applied automatically by a simple method. The drying or curing of the parting agent layer must be optimised for the parting agent in question and/or procedure selected. The application and drying/curing of the parting agent may take place either "off line", i.e. separately from the module manufacturing process, or "in line", i.e. during the module manufacturing process. If the parting agent is applied "in line", there is the possibility for the drying/curing to take place at the same time as the curing of the adhesive 14.

In order to recognise better the areas of the surface coated with the parting agent, a dye which is sufficiently thermally stable can be added to the parting agent solution or emulsion in a suitable concentration. Methylene blue is suitable, for example, which can be used, for example, in a concentration of between 0.1 percent and 3.0 percent by weight or preferably between 0.5 percent and 1.5 percent by weight.

A design example is given below, according to the present invention, for the manufacture of a module consisting of the carrier element 4 with the chip 2. The process can be used both for an individual carrier element 4 or a number of carrier elements 20–34 on the continuous film 36 and contains the following steps:

1.) Manufacture of the thin carrier element as an individual carrier element 4 or as carrier elements 20–34 on continuous film 36, consisting of fibre reinforced polymer material (e.g. epoxy resin, polyimide, polycyanate ester, BT resin) provided with a Cu/Ni/Au contact layer 8 on the underside and metallic contact areas 12 on the upper surface.

2.) Application of the parting agent onto the upper surface of the carrier element 4, 20–34. The parting agent is applied with a writing implement customary in the trade impregnated with the parting agent, e.g. a felt-tip pen, onto the areas of the upper surface or parts thereof, on which injection branches will later run for encapsulation of the chip 2. A 5% solution of phenyltrimethoxysilane is used in an ethanol/water mixture (95/5).

In order to recognise better the areas of the upper surface treated, methylene blue is added to the solution as a dye in a proportion of 1%. The drying/curing of the parting agent occurs under the parameters described under item 3.

3.) The chip 2 is glued using an epoxy resin adhesive, subjected to brief infrared precuring for fixing and approximately 1 minute final curing in the oven at a temperature of 180° C.

4.) Contacting of the chip 2 to the external wiring by means aluminium wires 16 of a thickness of 32 $\mu$m, using "wire-bond" technology.

5.) The chip 2 is encapsulated by means of a transfer moulding process using the transfer moulding compound 18.

6.) Removal of the injection channels 40.

7.) The carrier elements 20–34 are punched out of the continuous film 36.

8.) Installation into the chipcard.

We claim:

1. A process for the manufacture of a module comprising a carrier element and at least one IC chip for incorporation in chip cards or other data-carrier cards, the process comprising:

applying at least one IC chip to the carrier element;

bonding at least one IC chip with the carrier element;

passivating the carrier element at those areas at which the adhesion of a transfer-moulding mass to the carrier element is not desired, the passivation of the carrier element being carried out with a colored parting agent; and transfer-moulding a transfer-moulding mass over the IC chip.

2. A process of claim 1 wherein the colored parting agent contains a dye of adequate thermal stability.

3. A process of claim 2 wherein methylene blue is used as the dye in a concentration of 0.1 to 3.0 percent by weight.

4. A process of claim 1 wherein the parting agent comprises an organosilane with low surface tension.

5. A process of claim 4 wherein the parting agent is applied in concentrations from approximately 0.005 percent by weight, mixed with at least one of: ethanol, methanol, isopropanol, water, acetone, methylethylketone, methylenchloride, and dioxane and the like.

6. A process of claim 1 wherein the carrier element is an insulator, having a contact plane, the IC chip being essentially mounted on the insulator and connected with the contact plane.

7. A process of claim 1 wherein the transfer-moulding mass exhibits a high flexural resistance, a low thermal coefficient of expansion, flame-resistance, contracts only slightly on cooling and absorbs only very little moisture.

8. A process of claim 1 further comprising:

before the transfer-moulding step, a step of increasing the adhesion of at least one IC chip to the carrier element.

9. A process of claim 8 wherein the increase in the adhesion of at least one IC chip to the carrier element and mechanical stabilization of the combination is improved by an adhesive.

10. A process of claim 9 wherein the adhesive exhibits no further softening in the course of the subsequent process steps, is substantially free of bubbles, releases substantially no volatile constituents during hardening and has a degree of elasticity after hardening.

11. A process of claim 10 wherein fillers are added to the adhesive in order to substantially match the thermal coefficient of expansion of the adhesive to the combination of the carrier element and the IC chip.

12. A process of claim 1 wherein a plurality of carrier elements are applied to an endless film and divided on completion of the process into individual carrier elements.

13. A process of claim 2 wherein methylene blue is used as the dye in a concentration of 0.5 to 1.5 percent by weight.

14. A process of claim 4 wherein the parting agent is selected from the group consisting of an organofluorosilane, an alkyllalcoxysilane and an arylalcoxysilane.

15. A process of claim 4 wherein the parting agent is selected from the group consisting of: phenyltrimethoxysilane, phenyltriethoxysilane, phenyltrichlorosilane, methyltriethoxysilane, methyltrimethoxysilane, propyltrimethoxysilane, ethyltrichlorosilane, ethyltrimethoxysilane, diphenyldiethoxysilane, dimethyldichlorosilane, dimethyldiethyloxysilane, perfluorooctyltriethoxysilane, dimethyldimethoxysilane, triphenylethoxysilane and dodecyltriethoxysilane.

16. A process of claim 4 wherein the parting agent is applied in a mixture with water in concentrations from approximately 0.005 percent by weight.

17. A process of claim 7 wherein the transfer-moulding mass exhibits a flexural resistance greater than approximately 7 kp/mm$^2$.

18. A process of claim 1 wherein the transfer-moulding mass exhibits a flexural resistance greater than approximately 13 kp/mm$^2$.

19. A process of claim 1 wherein the transfer-moulding mass exhibits a thermal coefficient of expansion less than approximately $50 \times 10^{-6}$ °C.$^{-1}$.

20. A process of claim 1 wherein the transfer-moulding mass exhibits a thermal coefficient of expansion less than approximately $17 \times 10^{-6}$ °C.$^{-1}$.

* * * * *